United States Patent [19]

Codrington

[11] Patent Number: 4,764,894
[45] Date of Patent: Aug. 16, 1988

[54] MULTIPLE FIFO NMR ACQUISITION SYSTEM

[75] Inventor: Robert S. Codrington, Los Altos Hills, Calif.

[73] Assignee: Varian Associates, Inc., Palo Alto, Calif.

[21] Appl. No.: 136,499

[22] Filed: Dec. 28, 1987

Related U.S. Application Data

[63] Continuation of Ser. No. 691,783, Jan. 16, 1985, abandoned.

[51] Int. Cl.[4] .................. G11C 19/00; G06F 3/00; G01R 33/08
[52] U.S. Cl. .................................. 364/900; 324/312
[58] Field of Search ... 364/200 MS File, 900 MS File; 324/312

[56] References Cited

U.S. PATENT DOCUMENTS

| | | | |
|---|---|---|---|
| 4,159,532 | 6/1979 | Getson | 364/900 |
| 4,236,225 | 11/1980 | Jansen | 364/900 |
| 4,296,464 | 10/1981 | Woods | 364/200 |
| 4,374,428 | 2/1983 | Barnes | 364/900 |
| 4,425,616 | 1/1984 | Woodell | 364/200 |
| 4,571,671 | 2/1986 | Burns | 364/200 |
| 4,679,138 | 7/1987 | Epstein et al. | 364/200 |

OTHER PUBLICATIONS

*Microprocessors and Microcomputer Development Systems* by Mohamed Rafiquzzaman, copyright 1984, pp. 82-85.
*Principles of Digital Computer Design*, by Abd-alla & Meltzer, ©1976, pp. 250-256.

*Primary Examiner*—Gary V. Harkcom
*Assistant Examiner*—Lawrence E. Anderson
*Attorney, Agent, or Firm*—Stanley Z. Cole; Gerald M. Fisher; Edward H. Berkowitz

[57] ABSTRACT

Synchronous apparatus capable of a variety of operational states responds to a sequence of digital control words, each specifying a desired state and persistence time of the state. The control words are furnished to the apparatus from a self-clocked FIFO in accord with the persistence code. A selected sub-sequence of digital control words in ROM is placed in an auxiliary FIFO upon detection of a corresponding token in the main sequence and control is passed to the auxiliary FIFO to furnish the sub-sequence to the apparatus. At the conclusion of the sub-sequence control is returned to the main FIFO and the main sequence is resumed.

2 Claims, 3 Drawing Sheets

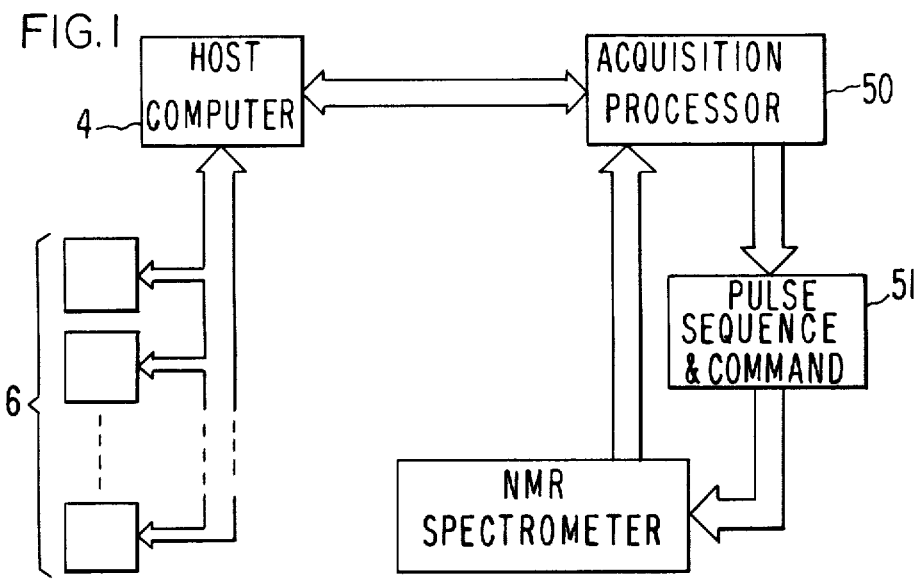
FIG.1
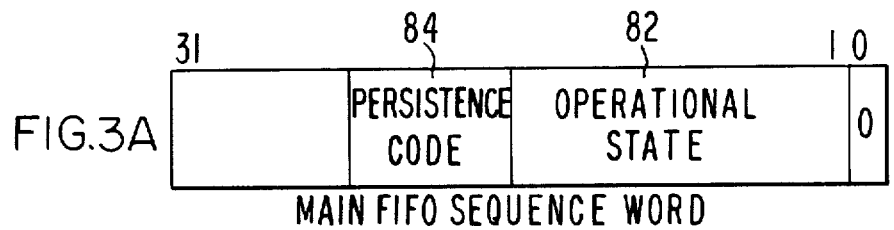
FIG.3A  MAIN FIFO SEQUENCE WORD
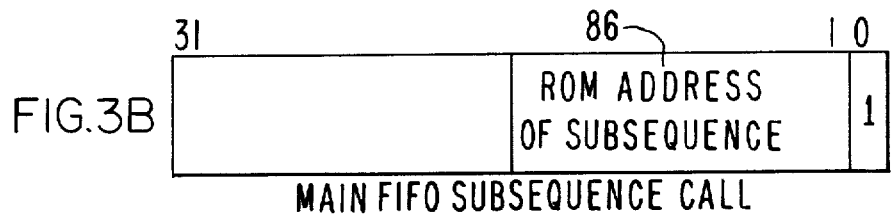
FIG.3B  MAIN FIFO SUBSEQUENCE CALL
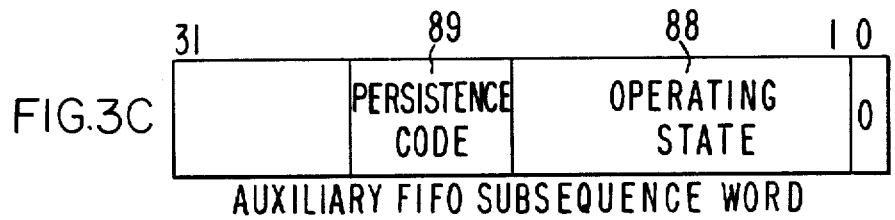
FIG.3C  AUXILIARY FIFO SUBSEQUENCE WORD
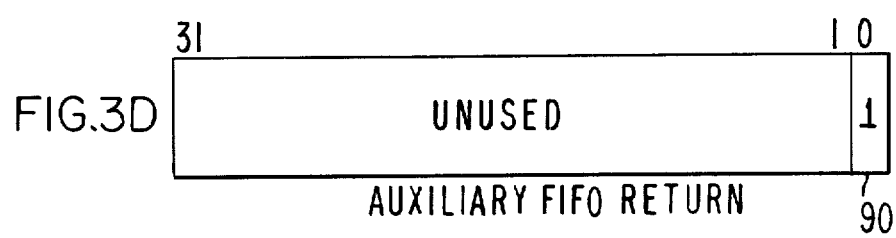
FIG.3D  AUXILIARY FIFO RETURN

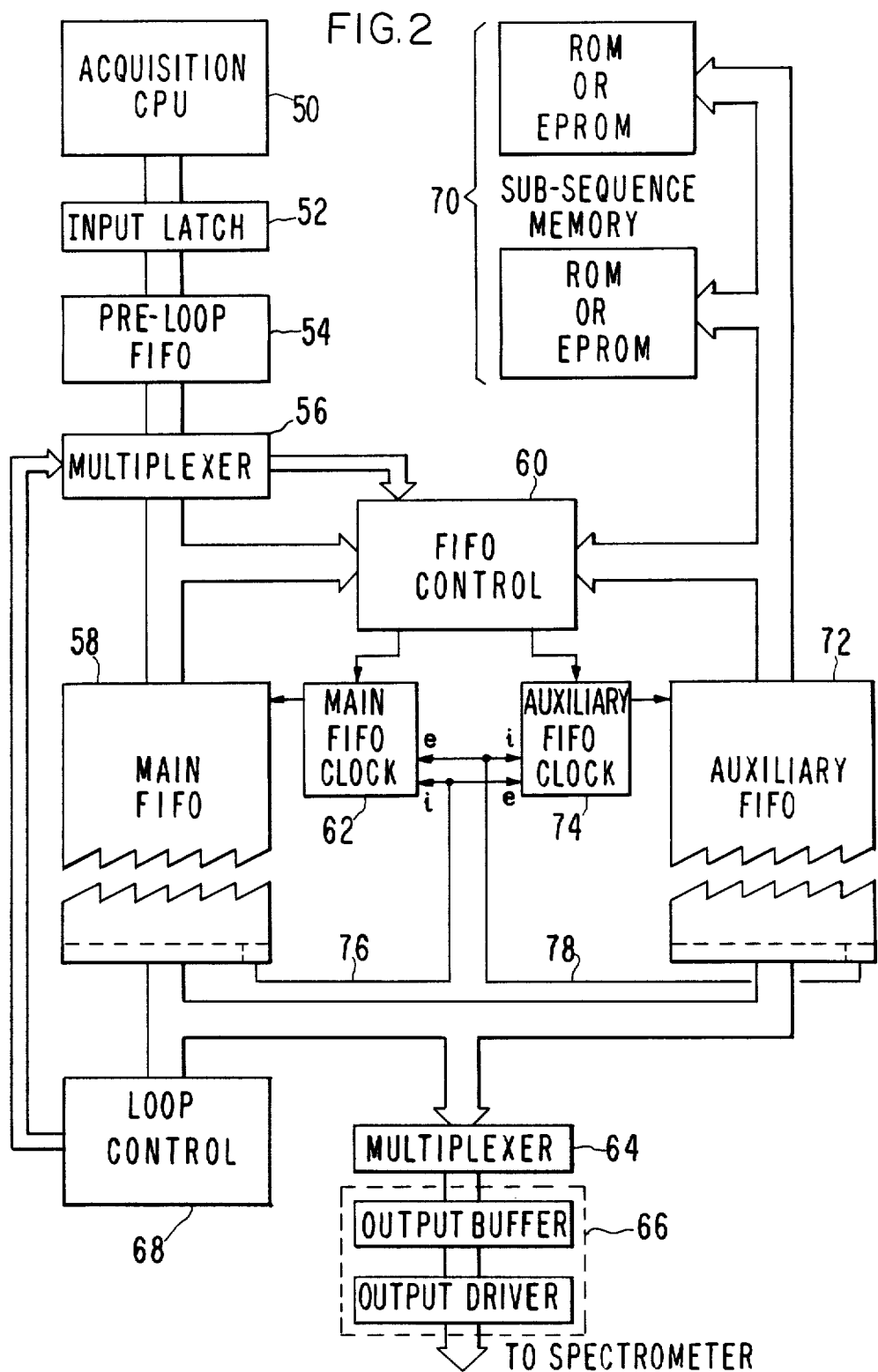

MULTIPLE FIFO NMR ACQUISITION SYSTEM

This application is a continuation of application Ser. No. 691,783, filed 1/16/85, now abandoned.

FIELD OF THE INVENTION

This invention is in the field of instrumentation for cyclic instrument control and data acquisition and particularly relates to time domain data acquisition systems for NMR and related measurements.

BACKGROUND OF THE INVENTION

In the prior art it was known to incorporate within NMR data control systems a FIFO containing a sequence of codes defining the respective sequence of operative states of the apparatus, each together with a persistence datum encoding a corresponding time interval during which each state is maintained. The imminent underflow of the FIFO caused an interrupt to a host processor which responded to reinitialize the FIFO. The sequence was therefore executed in precise synchrony. Such a system is described in U.S. Pat. No. 4,191,919.

Further, the FIFO based systems of the prior art address system requirements for enhanced information density by implementing re-entrant operation of the FIFO to reduce interrupt overhead. In this manner an entire set of periodically repetitive operations contained in a re-entrant FIFO structure could be rotated through an output register for a desired number of cycles (of the sequence) to control the spectrometer accordingly and re-inserted in the FIFO to maintain the queue. Another prior art feature permitted compressed repetitive instructions by defining a repetition field of the FIFO word for the purpose of specifying the number of times that a particular state and persistence interval are to be repeated. The purpose of such FIFO based system enhancement is to effectively increase the effective FIFO capacity in the number of control words asserted without interrupt of the host processor. A reentrant FIFO based system also incorporating a repetition feature is described in U.S. Pat. No. 4,375,676.

These prior art FIFO based systems are well adapted to many repetitions of a sequence of words not exceeding the maximum FIFO capacity in length, or to a large number of repetitions of a particular control word. These techniques are not well adapted to the execution of compact macros of instructions which may be desired for execution within the periodic sequence or to very long (non-repetitive) sequences which exceed the FIFO capacity.

BRIEF DESCRIPTION OF THE INVENTION

The present invention provides an effective extension of the length (number of command words) of the cyclic sequence by providing reference in the FIFO to sub-sequences resident in auxiliary memory. The present invention effectively "tokenizes" multiple operations which by their length do not easily reside directly in the operational FIFO. These multiple operations comprise certain subsequences at fixed addresses in auxiliary memory and are invoked by the occurrence in the main FIFO of a selected code. Thus, the effective "length" or number of words executable in a complete FIFO cyclic sequence is extended by the addressable length of the auxiliary memory and is to a much lesser extent limited by the capacity of the main FIFO.

When the sub-sequence is detected in tokenized form within the main sequence, the FIFO control apparatus initiates, as a parallel operation, the retrieval of the sub-sequence from auxiliary memory (ROM) and the initializing of an auxiliary FIFO. The main and auxiliary FIFO access the spectrometer interface through a multiplexer. When the sub-sequence token is encountered during output of the main FIFO sequence, control is passed to the auxiliary FIFO and the main FIFO suspends operation. When the sub-sequence has been fully transferred from the auxiliary FIFO, control is returned to the main FIFO and the main sequence resumes. The main FIFO preferably exhibits the re-entrant feature whereby the entire main sequence may be repeated a selected number of times.

BRIEF DESCRIPTION OF THE FIGURES

FIG. 1 depicts the control environment of an NMR apparatus incorporating the invention.

FIG. 2 is a block diagram of the FIFO system of the present invention.

FIG. 3A shows an example word format for main sequence execution.

FIG. 3B shows an example word format for causing a subsequence call.

FIG. 3C shows an example word format subsequence execution.

FIG. 3D shows an example word format for causing a return to mainsequence execution.

DETAILED DESCRIPTION OF THE INVENTION

Figure 4:
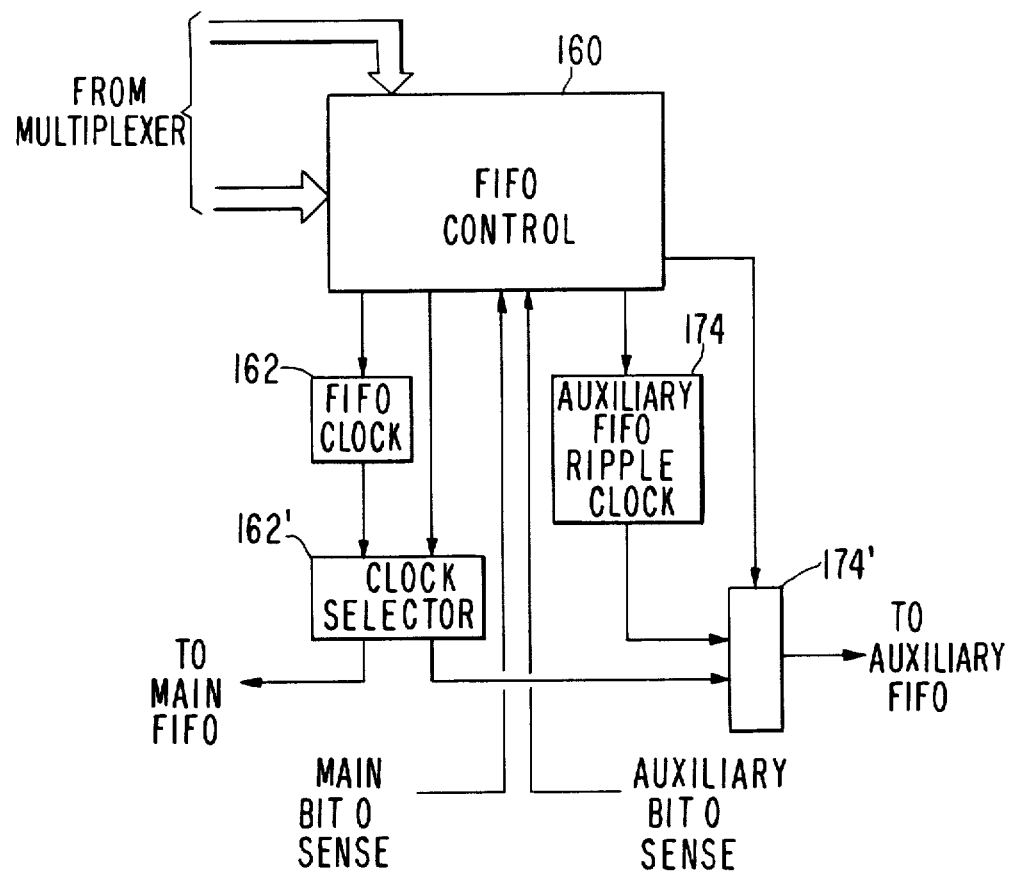
FIG. 4 is a partial block diagram of different embodiments of the invention.

One instrumental context for the present invention is shown in FIG. 1. There, an NMR spectrometer system comprises the spectrometer 2, a host computer 4 in association with a number of I/O peripheral devices 6 and a spectrometer controller or acquisition processor 50 form a data acquisition system for NMR measurements. An integral part of the acquisition processor 50 is the pulse sequence controller 51, the major portion of which forms the subject of the present invention as further described below. The terms "pulse sequence controller" and "instrumental controller" will not be differentiated. The present invention may supply pulses of standard length at selected times, or levels of selected length at selected times with full generality which is not limited by the particular context of NMR measurements which is here given for a specific context.

FIG. 2 illustrates the architecture of an expanded FIFO based instrumental controller. Acquisition processor 50 communicates through latch 52 with pre-loop FIFO 54, thence through multiplexer 56 with the main FIFO 58 and FIFO controller 60. As in prior art discussed above, a portion of the word passed to the FIFO 58 through the aforementioned chain will initiate a spectrometer operating state or command executable by the spectrometer apparatus. Another portion of the word passed to the FIFO contains persistence information, e.g., the time interval during which the operative state of the spectrometer is to continue. Persistence interval is metered by the main FIFO clock 62 which is initialized from the persistence portion of the FIFO word.

The currently executable word is presented to the NMR apparatus through multiplexer 64 to output handler 66. Concurrently the same control word is redirected through loop control 68 to FIFO 58 through multiplexer 56, thereby preserving the FIFO queue. It is understood that ordinarily a cyclic sequence which does not exceed the length of the main FIFO will be initialized in the main FIFO 58 and during loop operation the multiplexer 56 will inhibit further inputs permitting only the circulation of FIFO control words through the loop control 68 to multiplexer 56.

Turning now to FIG. 3A, there is observed a FIFO control word format suitable for circulation through the main FIFO 58 for direct execution. The format comprises an operational state portion 82, a persistence interval code 84 and possibly other fields to be discussed below and as described in prior art. A flag bit, bit 0 in this instance, remains 0 to so identify the executable sequence word as such.

FIG. 3B shows the format for a sub-sequence call control word containing an address portion which is the address of an entry point of a desired sub-sequence residing in auxiliary memory. Bit 0 is the sub-sequence flag bit and is set to 1 to so distinguish the sub-sequence call. When this bit is encountered in multiplexer 56, FIFO control 60 causes a fetch loop to commence with the address at the indicated entry point in ROM 70. The sub-sequence following the entry point is loaded into auxiliary FIFO 72 until the end-of-sub-sequence control code (bit 0=1) is encountered in the sub-sequence. It is preferred to load this end code also, thereby preserving an end mark in the auxiliary FIFO 72, and providing an active code or flag bit for control purposes during execution.

Loading of the auxiliary FIFO 72 is carried out in conventional ripple-down mode at maximum rate under control of the auxiliary FIFO clock 74, or other high speed clock (not shown). It will be apparent that this operation may be executed by a parallel structure addressing ROM.

During FIFO execution, the presence of the subsequence flag in the main FIFO sequence is detected and utilized to inhibit the main FIFO clock 58 and concurrently enable the auxiliary FIFO clock 74 in the self synchronized mode wherein the clock interval is taken from the persistence code 89 of the auxiliary FIFO control word. The main FIFO output is also monitored to detect the presence of the sub-sequence call flag. This occurrence causes control to transfer to the auxiliary FIFO 72 and the content of the auxiliary FIFO 72 advances through multiplexer 64 toward the spectrometer interface. When the return flag 90 is encountered in the auxiliary FIFO 72 (FIG. 3D) control is passed back to the main FIFO which resumes its rotation of control word information through loop control 68 and again provides out through multiplexer 64. The exchange of control between the main and auxiliary FIFOs 58 and 72 is shown symbolically by signal 76 inhibiting main FIFO clock 62 and enabling auxiliary FIFO clock 74 and through signal 78 performing the complementary function. Although not shown in detail, it will be understood that the respective signals logically determine a status bit from which FIFO control 60 activates the indicated FIFO. The clocks 62 and 74 are derived from a common source to assure synchrony and may comprise gates for a single physical clock source to the respective FIFOs.

Limitations on the length of the sub-sequence depend ultimately upon the data rate available for accessing ROM 70 and initializing the auxiliary FIFO 72 and the capacity of the latter. That is, there is a limit imposed by the time available for initializing the sub-sequence in FIFO 72 which limit is the interval between detection of the sub-sequence call bit at multiplexer 56 and the presence of the word containing such call at the output of main FIFO 58. This time interval is calculable from the sum of persistence times for all preceding main FIFO content. It is, therefore, desirable for FIFO control 60 to be capable of accessing ROM 70 at the highest rate and for maximum ripple rate operation for initializing auxiliary FIFO 72. Thus, auxiliary FIFO clock 74 is capable of clocking the auxiliary FIFO at a very high rate for initialization as well as operating at a somewhat lower rate.

FIFO control 60 is preferably an intelligent controller and in a preferred form is a parallel structure permitting concurrency of its two principal functions: supervision of FIFO 58 operation and initialization of Auxiliary FIFO 72. These functions are distinct and need not be mutually synchronous, it only being required that auxiliary FIFO 72 be ready to produce its content synchronously with the appearance of a corresponding token at the output of FIFO 58. The actual operation of FIFO 72 is identical to that of FIFO 58 with respect to presentation of the sequence control word at multiplexer 64. The source of the control word is invisible to the output buffer 66.

An advantage of the present architecture may be seen in the simplification of an effective variable length FIFO system. For a single FIFO system of the prior art, variable sequence length must be accommodated by an arrangement for gating re-entrant control words to the correct entrance stage of the single FIFO. The sequence length for re-entrant operation is then limited by the length of the single FIFO in stages. In the present architecture it is appropriate for the main FIFO length to be modest and preferably equal to or somewhat less lengthy than the shorter sequences because it is precisely the incremental length of the sequence that is supplied by the auxiliary FIFO.

A slightly different embodiment shown in FIG. 4 employs a single FIFO clock 162 for clocking either the main or auxiliary FIFOs 158 and 172 through clock selecter 162'. The latter is responsive to logic in controller 160 for resolving the relative status of main and auxiliary FIFOs by monitoring bit 0 of the word currently active at the output of the respective FIFOs and for implementing special overrides such as power-up reset and like exceptional conditions. A special high speed clock 174 is selectable by controller 160 when a subsequence call is detected in the main sequence as previously discussed. This high speed clock serves the limited purpose of of rapid initialization of the auxiliary FIFO. In this manner the auxiliary FIFO is clocked in precisely the same manner as the main FIFO during subsequence execution operations, but the auxiliary FIFO may be run at a much higher rate for initialization purposes.

Certain rules and limitations will be apparent from the discussions above. Time limitations are inherent in the time available for initializing the auxiliary FIFO. This and the incidence of multiple subsequence calls in proximity (so as to limit the time for initialization of the auxiliary FIFO) and other conditions are preferably resolved in software which serves the purpose of compiling and allocating the desired operational state information prior to operations. Many of the special situations alluded to here may be remedied in a straightforward fashion. For example, the desired minimum time interval between subsequence calls can be gained by incorporating a portion of the content of the desired subsequence within the main sequence and then off-setting the entry point when the subsequence call occurs.

The system as described is capable of extension in several particulars. It is apparent that repetition and re-entrant features may be incorporated in the auxiliary FIFO portion of the apparatus, if so desired. For most purposes, the repetition feature appears to be sufficient for implementation in either the main or auxiliary FIFO. The re-entrant feature for the auxiliary FIFO is optional; if such function is present there is established a capability for nested loops of effective sequencing.

The architecture here described is extendable in the lateral sense by providing for a plurality of hierarchical auxiliary FIFOs in straightforward extensions of the apparatus described above. In this manner, the length of an effective instruction sequence to the device interface driver 66 may be further extended. Alternatively, nested looping is achievable by forming an inner loop through direction of the output of a first auxiliary FIFO to initialize a second auxiliary FIFO, thereby preserving the queue, then triggering an exchange of control to the second auxiliary FIFO. The latter then operates symmetrically to transfer its output, again both to the multiplexer 66 and to re-initialize the first auxiliary FIFO, again preserving the queue.

FIFO based instrument control and data acquisition systems have been implemented in apparatus where synchrony of discrete operational states as a principal requisite of desired instrument performance. Instruments which require data in the time domain are generally an example of a class of such apparatus. Other functional classes of equipment include those wherein it is desired to control the time dependence of some instrumental parameter, P(t) as well as, or in addition to the synchrony of P(0) and P($t_{final}$), e.g., the beginning and end points. The time dependence of magnetic gradients and RF pulse shapes employed for magnetic resonance imaging equipment is an example of both such desiderata.

While there has been illustrated and described what is at present considered to be a preferred embodiment of the present invention, it will be appreciated that numerous changes and modifications are likely to occur to those skilled in the art, and it is intended in the appended claims to cover all those changes and modifications which fall within the true spirit of the scope of the present invention.

What is claimed is:

1. The method of controlling operational status of a synchronous device comprising:

Storing a main sequence of a first plurality of digital control words in a sequence of adjacent memory registers comprising initial and final memory registers and at least one intermediate memory register disposed therebetween, said registers adapted for serial transfer of the contents thereof from said initial memory register through said intermediate memory register to said final memory register, each said digital control word comprising at least a first and second portion thereof, storing in addressable storage space at least one auxiliary sequence comprising a second plurality of digital control words, each said digital control word of said auxiliary sequence comprising at least a first and second portion thereof, propagating said first sequence of digital control words through said sequence of said plurality of adjacent memory registers, said step of propagating occurring in incremental intervals of time, determining the duration of each said incremental interval of time from the content of said first portion of each said control word, detecting a preselected one of said control words and in response thereto, retrieving said auxiliary sequence of digital control words from said addressable storage space and inserting said auxiliary sequence of digital control words into an auxiliary sequence of adjacent memory registers, said auxiliary sequence and said main sequence of digital control words operating to form a composite sequence of digital control words, and controlling the state of said synchronous device in accord with said second portion of said digital control word of said composite sequence of digital control words.

2. A variable length FIFO register for furnishing a sequence of digital words to an output register, comprising first FIFO means comprising an input stage, an output stage, and a plurality of intermediate communicating stages serially disposed between said input and output stage, said first FIFO means for receiving a first list of data at said input stage and propagating said list through said plurality of intermediate communicating stages to said output stage, said output stage adapted to communicate with said output register, pre-FIFO decode means for detecting a preselected token datum in said first list of data prior to receipt of said preselected token datum by said input stage, memory means for retaining a second list of data, second FIFO means comprising another plurality of communicating stages terminating in second FIFO output stage, said second FIFO means for receiving said second list of data from said memory means and propagating said second list of data to said second FIFO output stage, said second FIFO output stage adapted to communicate with said output register, second list fetch means responsive to said pre-FIFO decode means for retrieving said second data list from said memory means and initializing second FIFO means, FIFO control transfer means for deactivating said first FIFO means and activating said second FIFO means in reponse to a preselected datum of said first list of data, said preselected token datum then occupying said output stage and for deactivating said second FIFO means and reactivating said first FIFO means in response to another preselected datum of said second list then occupying a selected stage of said second FIFO means.

* * * * *